United States Patent
Katsuyama et al.

(10) Patent No.: US 8,736,862 B2
(45) Date of Patent: May 27, 2014

(54) OPERATING SECTION STRUCTURE, IMAGE PROCESSING APPARATUS, AND INFORMATION PROCESSING APPARATUS

(75) Inventors: Goro Katsuyama, Tokyo (JP); Jumpei Kanehisa, Tokyo (JP)

(73) Assignee: Ricoh Company, Limited, Tokyo (JP)

( * ) Notice: Subject to any disclaimer, the term of this patent is extended or adjusted under 35 U.S.C. 154(b) by 423 days.

(21) Appl. No.: 12/929,221

(22) Filed: Jan. 10, 2011

(65) Prior Publication Data

US 2011/0181903 A1 Jul. 28, 2011

(30) Foreign Application Priority Data

Jan. 26, 2010 (JP) ................. 2010-013938

(51) Int. Cl.
- *G06F 15/00* (2006.01)
- *G06K 15/00* (2006.01)
- *G06F 1/00* (2006.01)

(52) U.S. Cl.
USPC ............................ 358/1.14; 358/1.9; 358/1.16

(58) Field of Classification Search
CPC combination set(s) only.
See application file for complete search history.

(56) References Cited

U.S. PATENT DOCUMENTS

| | | | |
|---|---|---|---|
| 6,507,720 B2 | 1/2003 | Kabumoto et al. |
| 6,690,901 B2 | 2/2004 | Katsuyama et al. |
| 6,785,488 B2 | 8/2004 | Katsuyama |
| 6,848,685 B2 | 2/2005 | Katsuyama |
| 6,882,817 B2 | 4/2005 | Kita |
| 7,108,338 B2 | 9/2006 | Katsuyama et al. |
| 7,133,629 B2 | 11/2006 | Kita |
| 7,275,808 B2 | 10/2007 | Katsuyama et al. |
| 7,302,204 B2 | 11/2007 | Katsuyama et al. |
| 7,364,039 B2 | 4/2008 | Katsuyama |
| 7,389,071 B2 | 6/2008 | Katsuyama et al. |
| 7,469,981 B2 | 12/2008 | Katsuyama et al. |
| 7,840,167 B2 | 11/2010 | Taguchi et al. |
| 2002/0009310 A1 | 1/2002 | Kabumoto et al. |
| 2002/0150403 A1 | 10/2002 | Katsuyama et al. |
| 2002/0195915 A1 | 12/2002 | Katsuyama et al. |
| 2003/0052956 A1 | 3/2003 | Katsuyama |
| 2003/0170041 A1 | 9/2003 | Katsuyama |
| 2003/0215267 A1 | 11/2003 | Kita |
| 2004/0114958 A1 | 6/2004 | Katsuyama et al. |
| 2004/0131390 A1 | 7/2004 | Kita |
| 2005/0211594 A1 | 9/2005 | Katsuyama |
| 2005/0270345 A1 | 12/2005 | Katsuyama et al. |
| 2006/0002743 A1 | 1/2006 | Katsuyama et al. |
| 2006/0023005 A1 | 2/2006 | Katsuyama et al. |
| 2007/0028187 A1 | 2/2007 | Katsuyama |
| 2008/0112021 A1 | 5/2008 | Katsuyama |
| 2008/0130071 A1 | 6/2008 | Katsuyama |
| 2009/0007232 A1 * | 1/2009 | Kasatani .................... 726/2 |
| 2009/0009829 A1 | 1/2009 | Katsuyama |
| 2009/0074494 A1 | 3/2009 | Katsuyama et al. |
| 2009/0123192 A1 | 5/2009 | Taguchi et al. |

FOREIGN PATENT DOCUMENTS

| | | |
|---|---|---|
| JP | 2008-276329 | 11/2008 |
| JP | 2008-277886 | 11/2008 |
| JP | 2008277886 A * | 11/2008 |
| JP | 2009-009347 | 1/2009 |

* cited by examiner

*Primary Examiner* — Thierry L Pham
(74) *Attorney, Agent, or Firm* — Harness, Dickey & Pierce, P.L.C.

(57) ABSTRACT

An operating section structure positioned forward of a document scanning unit. The operating section structure includes: an image display surface; and an authentication device placement surface for mounting a detachable authentication device at an angle different from the image display surface.

24 Claims, 15 Drawing Sheets

OPERATING SECTION STRUCTURE, IMAGE PROCESSING APPARATUS, AND INFORMATION PROCESSING APPARATUS

CROSS-REFERENCE TO RELATED APPLICATIONS

The present application claims priority to and incorporates by reference the entire contents of Japanese Patent Application No. 2010-013938 filed in Japan on Jan. 26, 2010.

BACKGROUND OF THE INVENTION

1. Field of the Invention

The present invention relates to an operating section structure, an image processing apparatus and an information processing apparatus having the operating section structure, and specifically relates to an operating section structure capable of mounting a detachable authentication device usable on an image processing apparatus such as an MFP, a copying machine, a printer, a scanner, and an MFP having these functions, and further relates to an operating section structure capable of mounting an authentication device attachable to and detachable from an information processing apparatus such as an IC card settlement system located in a company cafeteria, a newsstand, or the like and an IC card access control system installed on a door of a conference room or the like.

2. Description of the Related Art

In electrophotographic image processing apparatuses and the like, an authentication device that reads IC cards or fingerprints is often not standard equipment but is added as an option (an exemplary structure is known to perform personal authentication, without an authentication device added as an option, by pressing an authentication key (log-in key) and then entering a user ID and a password with a numeric keypad or a keyboard displayed on a screen).

In arranging such an authentication device on an image processing apparatus and the like, the fact is taken into consideration that right-handed users are predominant and a numeric keypad provided on an operational panel is located on the right hand side of the operational panel in most cases. Thus, it is generally thought that an authentication key, which is likely to be used with the keypad or the operational panel, should be arranged near the right hand portion of the operational panel so that users can easily recognize it and use it.

In recent years, readers for an SD card, a USB memory, and the like are often arranged in the periphery of the operational panel and thus, it should also be taken into consideration that these devices may be arranged in addition to the authentication device. If the authentication device is provided as an optional device and is accommodated in the apparatus body of e.g. an image processing apparatus, no wiring is exposed and its external appearance is prevented from being cluttered.

However, if the authentication device is provided as an optional device, it is necessary to secure a space somewhere in the apparatus body to store therein the authentication device (the authentication device is available in a modular form in many cases and is referred to as an authentication module; however it is referred to as the authentication device herein, unless otherwise necessary). Furthermore, the percentage of attaching the authentication device is still small. In designing the layout, the priority for such authentication device is low. Consequently, the device is in some cases accommodated in a vacant space in the apparatus body, such as a left side portion of the operational panel, where it may not be suitable for authentication operations.

Accommodating the authentication device in the apparatus body makes it hard to recognize where to place an IC card or a hand (actually, a fingerprint of a finger). This will create confusion for users and difficulty in use unless the device is arranged more recognizable manner.

Meanwhile, the authentication device itself is often purchased from another company and then is attached to the apparatus body before being marketed. Thus, the authentication device is often mounted on (externally attached to) the apparatus body rather than being accommodated in the apparatus body. However, when the authentication device as an option is mounted externally on the apparatus body of the image processing apparatus and the like, the apparatus body needs to be designed to store therein wiring, otherwise the wiring is exposed and likely to cause damage to the connector portion or to give an impression of cluttered appearance.

When the mounting space for the authentication device cannot be secured on an upper portion of the apparatus body, the device may be mounted, as an external device, on a mounting table attached to a side of the apparatus body. This causes the external appearance to be cluttered, and also causes the footprint of the apparatus body to be increased.

The structures disclosed in Japanese Patent Application Laid-open No. 2008-277886 and Japanese Patent Application Laid-open No. 2008-276329, as illustrated in FIG. 17A, allow an authentication device to be accommodated in on the right hand side of the operating section. However, neither additionally arranging readers for an SD card, a USB memory, and the like, nor performing authentication by an authentication key and the like without using the authentication device is considered.

The structure disclosed in Japanese Patent Application Laid-open No. 2009-009347, as illustrated in FIG. 17B, allows an authentication device to be mounted externally on the right hand side of the operating section. However, mounting requires attaching a mounting table on the side of the operating section. This may give an impression of cluttered appearance and may also increase the footprint of the apparatus body.

Apparatuses 1 depicted in FIGS. 17A and 17B are each provided with an automatic document feeder (ADF) 2, an image forming unit 3, a paper feeding unit 5 provided with a plurality of paper feed trays 4, and an operating section 6. The operating section 6 includes an operational panel 7 and an authentication device mounting unit 8.

SUMMARY OF THE INVENTION

It is an object of the present invention to at least partially solve the problems in the conventional technology.

According to an aspect of the present invention, there is provided an operating section structure positioned forward of a document scanning unit, the operating section structure including: an image display surface; and an authentication device placement surface for mounting a detachable authentication device at an angle different from the image display surface.

According to another aspect of the present invention, there is provided an image processing apparatus including an operating section structure positioned forward of a document scanning unit, wherein the operating section structure includes: an image display surface; and an authentication device placement surface for mounting a detachable authentication device at an angle different from the image display surface.

According to still another aspect of the present invention, there is provided an information processing apparatus including an operating section structure positioned forward of a document scanning unit, wherein the operating section structure includes: an image display surface; and an authentication device placement surface for mounting a detachable authentication device at an angle different from the image display surface.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The present invention relates to an operating section structure capable of mounting a detachable authentication device usable on an image processing apparatus such as an MFP, a copying machine, a printer, a scanner, and an MFP having these functions, and on an information processing apparatus such as an IC card settlement system located in a company cafeteria, a newsstand, or the like and an IC card access control system installed on a door of a conference room or the like. On the front side of a document scanning unit, an image display surface and an authentication device placement surface, on which a detachable authentication device is externally mounted at an angle different from that of the image display surface, are provided. The image display surface includes a liquid crystal display (LCD) screen with or without a touch panel. The authentication device includes a non-contact communications type IC card reader/writer, a magnetic card reader/writer, an optical fingerprint scanner, and a security code input device with a numeric keypad. The device a device that performs not only authentication but also charge controls, such as a prepaid (subtractive) card reader/writer on which a subtractive card with the number of units prepaid in advance is placed while in use. However, the present invention is not limited to these and exemplary embodiments described with the accompanying drawings below.

First Embodiment

Figure 1:
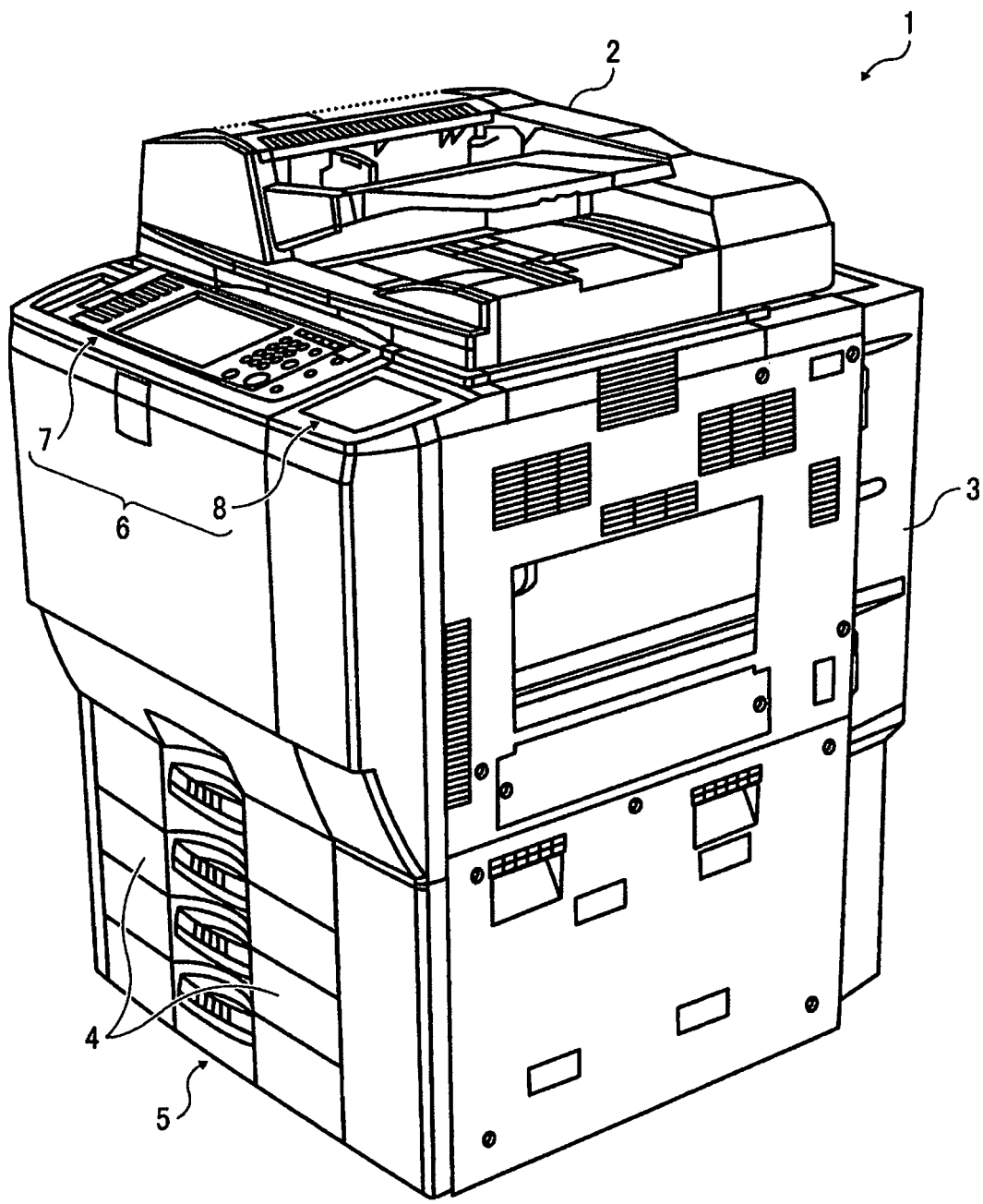
FIG. 1 is a perspective view of an image processing apparatus provided with an operating section composed of an operation panel and an authentication device mounting portion according to a first embodiment of the invention viewed from the right front side.
Figure 17A:
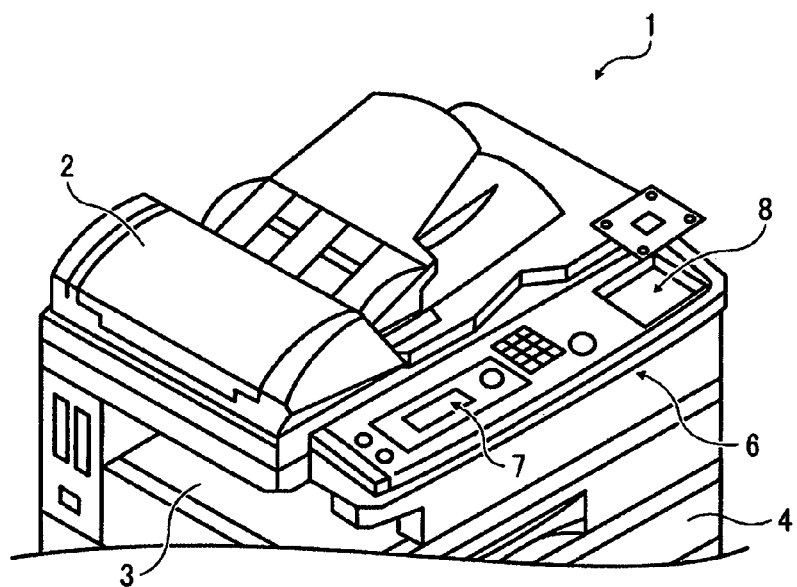
FIGS. 17A and 17B are perspective views illustrating exemplary arrangements of an authentication device on conventional image processing apparatuses.
Figure 17B:
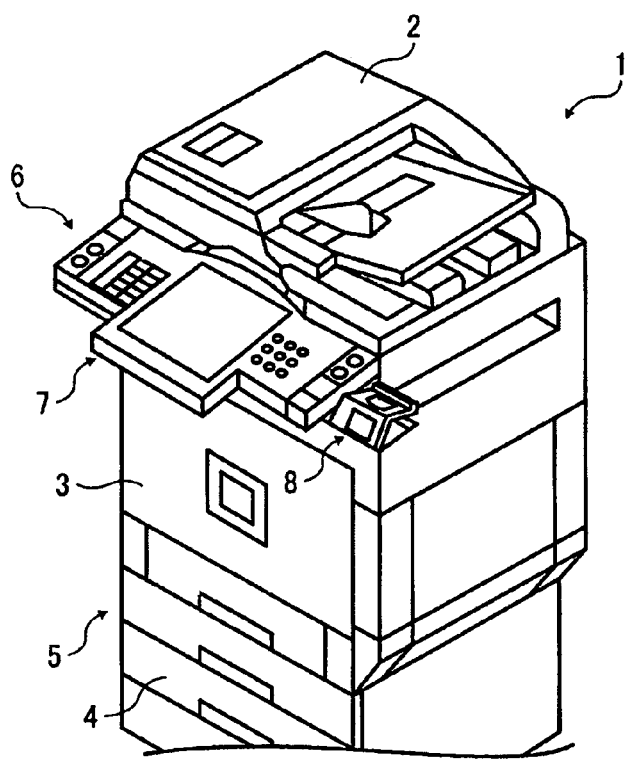

FIG. 1 is a perspective view of an image processing apparatus provided with an operational panel and an authentication device mounting portion according to a first embodiment of the invention viewed from the right front side. An image processing apparatus 1 depicted in FIG. 1 (hereinafter, simply referred to as an apparatus 1) may be an MFP, a copying machine, a printer, a scanner, and an MFP having these functions. The apparatus 1 is basically the same as conventional apparatuses depicted in FIGS. 17A and 17B, and includes an automatic document feeder (ADF) 2, an image forming unit 3, a paper feeding unit 5 provided with a plurality of paper feed trays 4, and the like. An operating section 6 is provided on an upper surface of the portion projected forward of the upper portion of the image forming unit 3, and the operating section 6 includes an operational panel 7 and an authentication device mounting unit 8.

Figure 2:
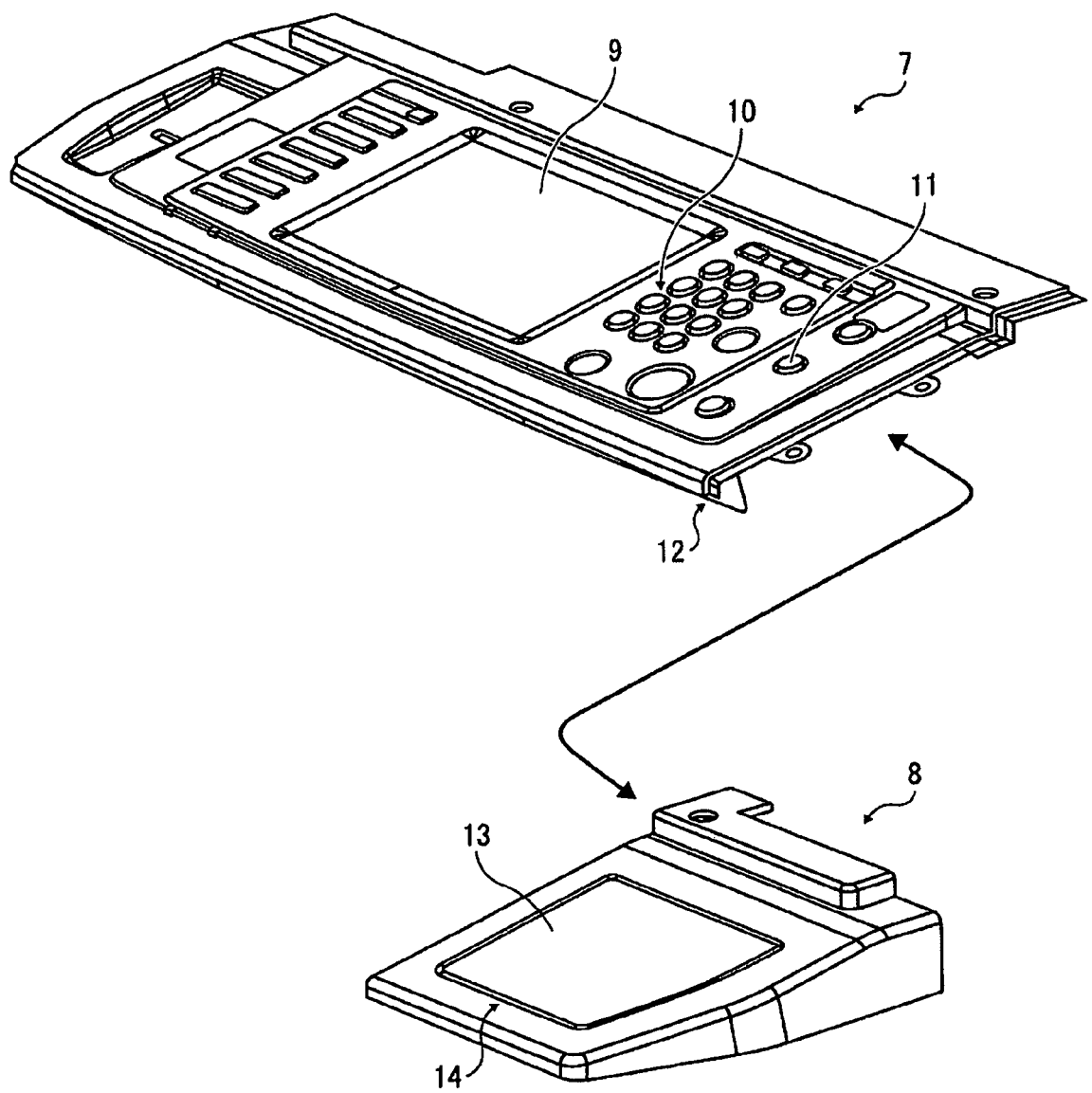
FIG. 2 is an enlarged exploded view of the operational panel and the authentication device mounting portion of the apparatus depicted in FIG. 1.
Figure 4A:
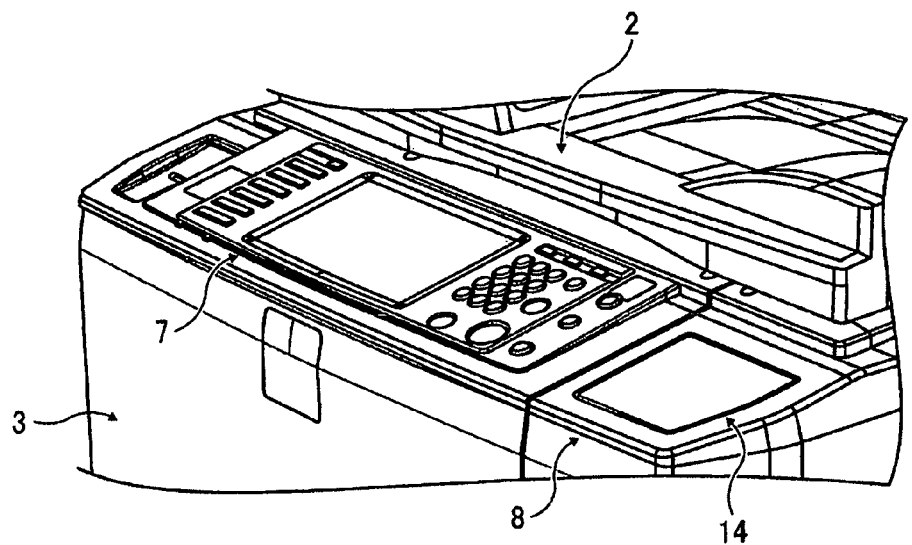
FIG. 4A is a perspective view of the apparatus depicted in FIG. 1 with no authentication device mounted on the authentication device mounting portion.
Figure 4B:
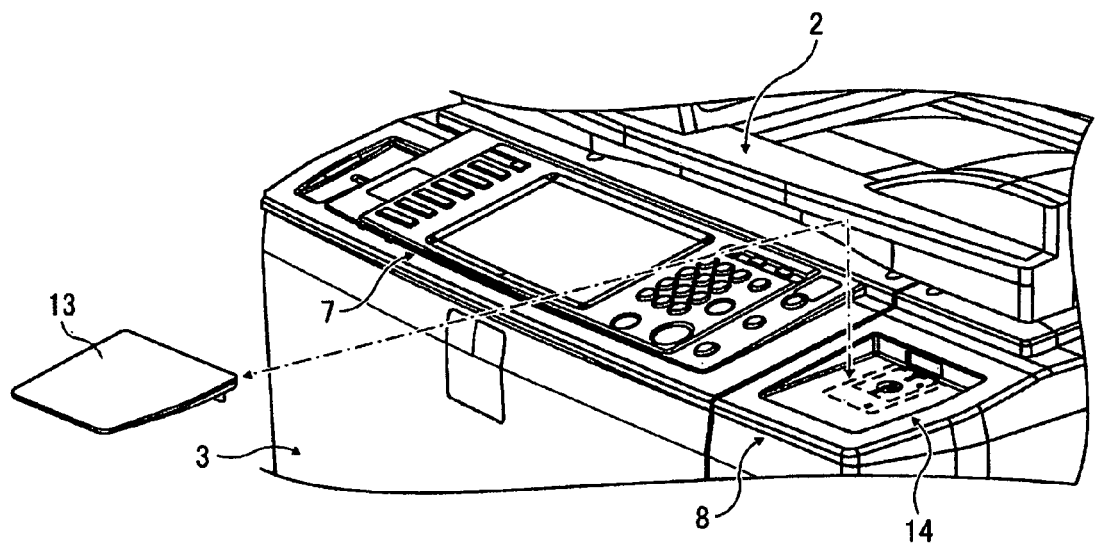
FIG. 4B is a perspective view with a cover being removed so as to mount the authentication device.

FIG. 2 is an enlarged exploded view of the operational panel and the authentication device mounting portion of the apparatus depicted in FIG. 1. The operational panel 7 uses an LCD and the like, and is provided with an image display surface 9 inclined descending towards the front, a numeric keypad 10, and an authentication key (log-in key) 11. The reference numeral 12 represents a dividing portion from the authentication device mounting unit 8. The authentication device mounting unit 8 is arranged on the right hand side of the operational panel 7 viewed from the front side of the apparatus, with the consideration of the fact that right-handed users are predominant. More specifically, the authentication device mounting unit 8 having a surface inclined descending towards the front like the operational panel 7 and a cover 13 is arranged at least on the right hand side of the image display surface 9. The cover 13 is placed on a concave portion 14 for mounting an authentication device as depicted in FIG. 4B. FIGS. 4A and 4B are perspective views of the apparatus depicted in FIG. 1, FIG. 4A with no authentication device being mounted on the authentication device mounting portion, and FIG. 4B with the cover 13 being removed to expose the concave portion 14 so as to mount the authentication device.

Figure 3:
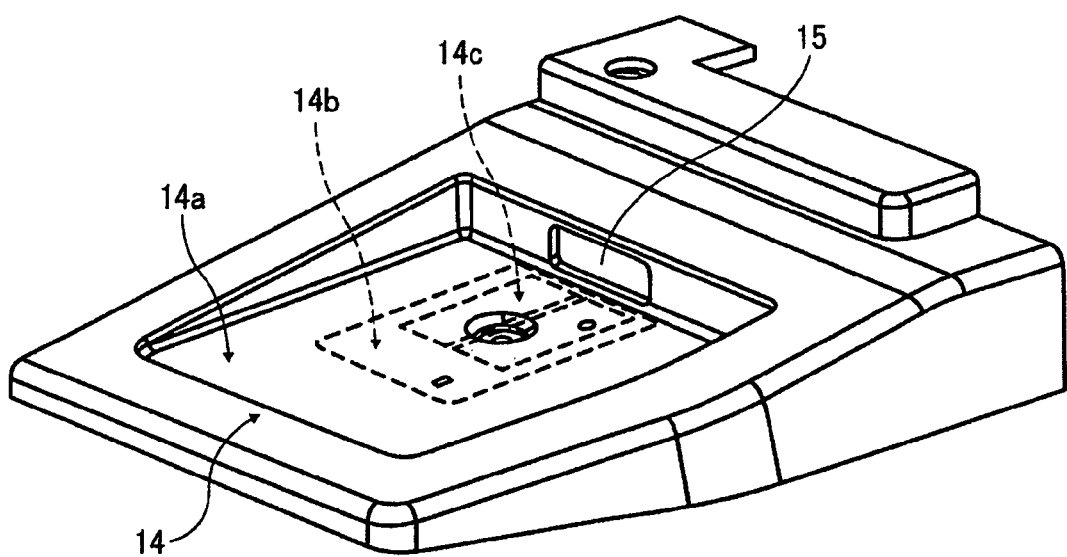
FIG. 3 is an enlarged perspective view illustrating an exemplary structure of the authentication device mounting portion of the operating section depicted in FIG. 2.
Figure 16A:
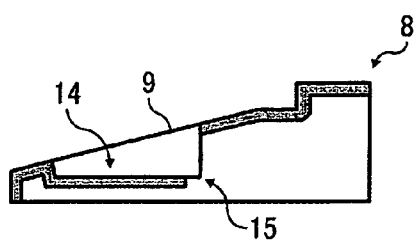
FIGS. 16A to 16G are diagrams conceptually illustrating the cross sectional structures of the operational panel and the authentication device mounting portion according to the invention.

FIG. 3 is an enlarged perspective view illustrating an exemplary structure of the concave portion 14 for mounting an authentication device. The surface of the concave portion 14 for mounting an authentication device is nearly a horizontal authentication device placement surface as depicted in FIG. 16A. The surface of the concave portion 14 can be formed, for example, to have a smooth surface, and by adhering two kinds of double-sided tapes on the smooth surface, areas with two kinds of grains can be provided. More specifically, in the example depicted in FIG. 4, with two kinds of U-shaped double-sided tapes prepared, a larger size tape is adhered to form a first grain area (coarse grain area) 14a, a smaller size tape is adhered to the inside of the larger size tape to form a second grain area (fine grain area) 14b, and a non-grain area 14c is formed inside the second grain area 14b. The tapes having such shapes allow a worker to adhere the tapes without confusion. The reference numeral 15 depicted in FIG. 3 represents an opening formed on the back surface of the concave portion 14 for inserting a later-described USB cable.

Figure 5A:
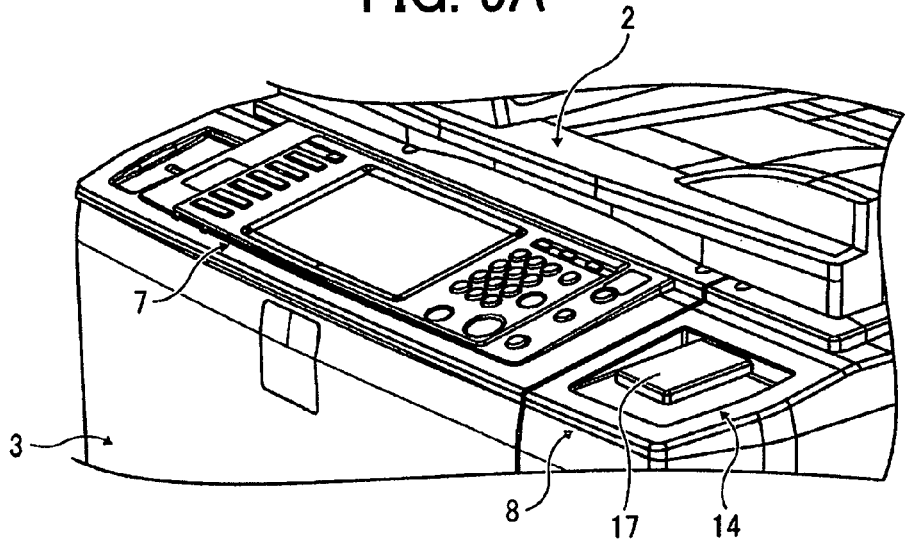
FIG. 5A is a perspective view of the apparatus depicted in FIG. 1 with the authentication device mounted on the authentication device mounting portion.
Figure 5B:
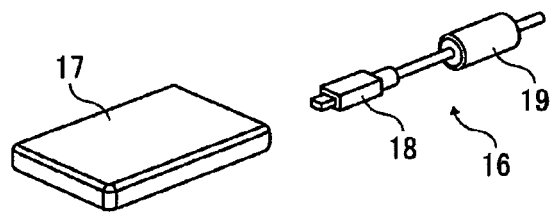
FIG. 5B is a perspective view illustrating an exemplary wiring layout of the authentication device.
Figure 5C:
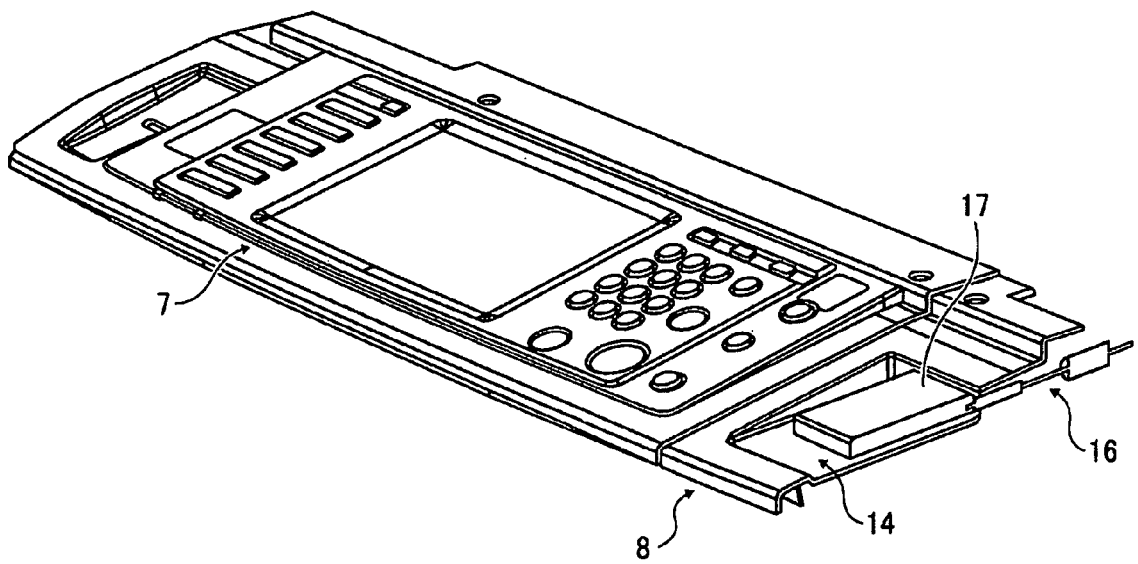
FIG. 5C is a cross sectional view illustrating its main parts.
Figure 6A:
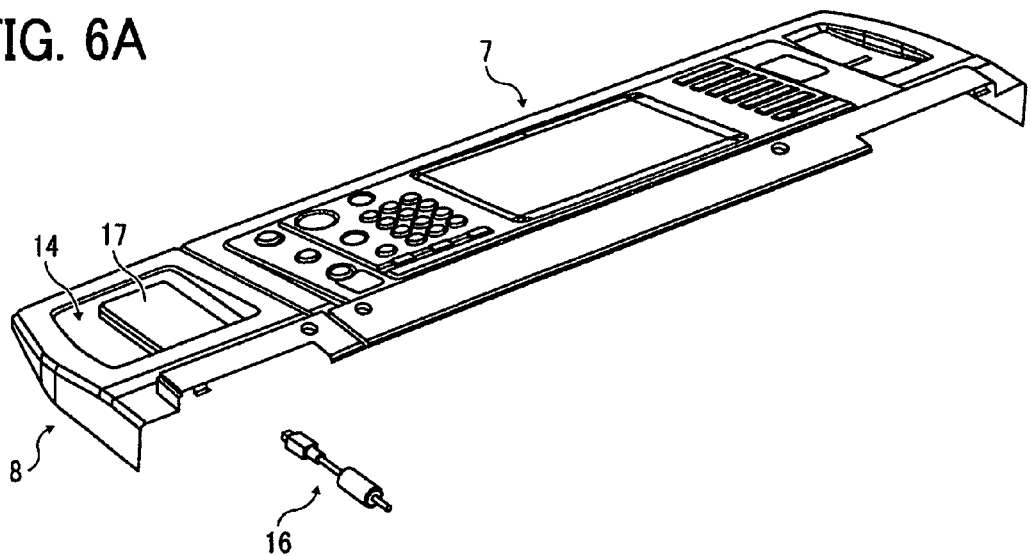
FIGS. 6A and 6B are perspective views illustrating the operational panel and the authentication device in the state depicted in FIGS. 5A to 5C viewed from the back of the apparatus depicted in FIG. 1, FIG. 6A being before wiring, and FIG. 6B being after wiring.
Figure 6B:
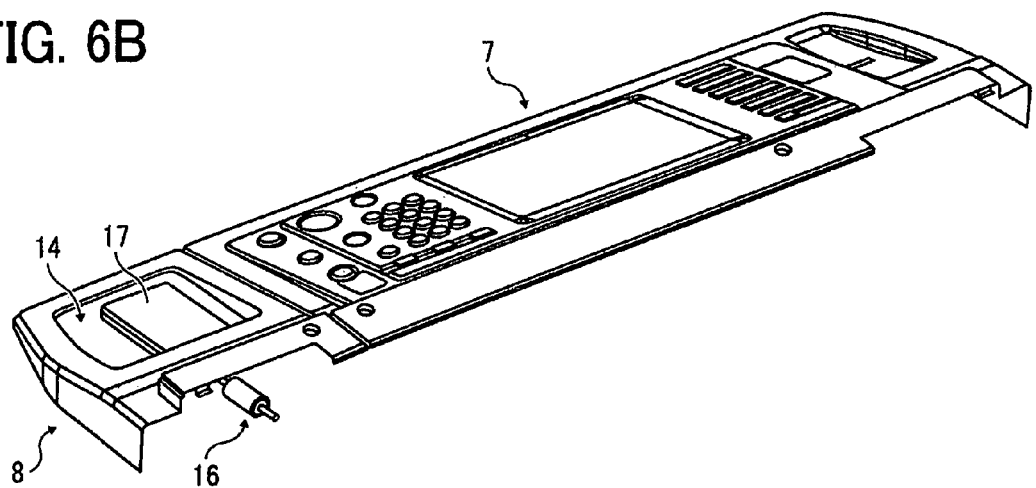
Figure 7:
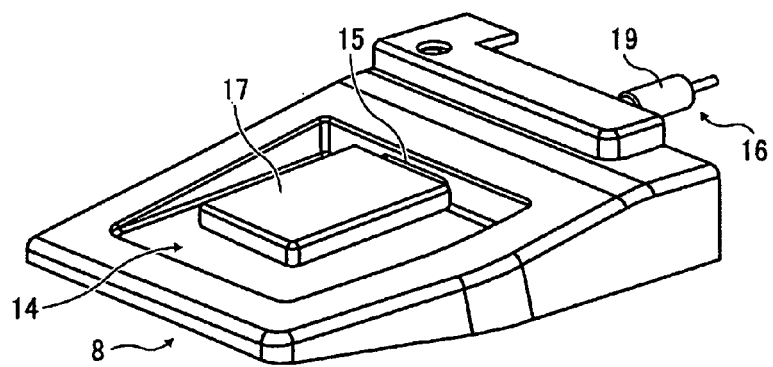
FIG. 7 is an enlarged perspective view of an authentication panel mounting portion in the state depicted in FIG. 5A.

When an authentication device is to be mounted on the concave portion 14 for mounting an authentication device as depicted in FIG. 5A, the first grain area 14a, the second grain area 14b, and the non-grain area 14c are formed with the double-sided tapes as described above, and an authentication device 17 with a USB cable 16 disconnected is placed aligning with the second grain area 14b. When the second grain area 14b is formed to match the contour of the authentication device 17, the authentication device 17 can be easily aligned with the mounting position. Thereafter, a detachable connector 18 of the USB cable 16 is connected, as depicted in FIGS. 6A and 6B, to a connector of the authentication device 17 (not depicted) from behind the back surface of the authentication device 17 through the opening 15. Thus, the authentication device 17 can be placed, as depicted in FIG. 5A and FIG. 7, at the position where the opening 15 is hidden behind but the connector 18 can be inserted. Therefore, skills or adjustments for alignment are not required, and the authentication device 17 can be mounted at the mounting portion without variations. When the opening 15 is formed wider in the width direction of the back surface of the concave portion 14 as depicted in FIG. 3, the connector 18 and a ferrite core 19 with different shapes depending on countries can be handled easily, which is convenient. Furthermore, with the opening 15 thus formed, the connector 18 is not likely to be damaged, and the burden for attachment/detachment of the connector 18 can be reduced.

With the opening 15 thus provided, even when the externally mounted authentication device 17 to be arranged aligning with the placement surface is a wired type having a cable, as depicted in the figures, the connector and the cable can be, hidden inside the operating section. Thus, when the authentication device 17 is mounted as an option, the appearance of the apparatus as a whole is not ruined and the connector and the cable are not likely to be damaged.

When the authentication device is not added as an option to the operating section 6 of the apparatus 1 provided with the image display surface 9, personal authentication can be performed by pressing the authentication key (log-in key) 11 and then entering a user ID and a password with the numeric keypad 10 and a keyboard appearing on the screen of the image display surface 9.

In the present embodiment, because the authentication device 17 is positioned projecting forward of the image processing apparatus 1, it is positioned closer to a user standing position. Thus, the authentication operation using a card or a fingerprint, which is troublesome for users, can be performed easily. By making the angles of the image display surface 9 and the placement surface for the authentication device 17 different and selectable appropriately for their operations, the image display surface 9 of the operational panel 7 and the surface of the concave portion 14 that is the placement surface for the authentication device 17 can be optimized to make them easier to use. In the present embodiment depicted in the figures, the bottom surface of the concave portion 14, which is the placement surface for the authentication device 17, is provided below the image display surface 9 and thus the reading of optical display of the operational panel 7 is not interfered.

Because the authentication device 17 is not mounted above the operating section 6 but is fixed side by side with the operating section 6, the structure is simplified. Furthermore, the area of the operating section 6 is not expanded towards the left. Thus, even when the apparatus is of an in-body paper discharging type, taking out operations of discharged paper are not hindered. Even when the apparatus is not an in-body paper discharging type, maintenance operations, which are performed with the front door opened, and paper refill operations are not hindered. The image display surface 9 and the authentication device mounting unit 8 are positioned forward of the ADF 2, and their surface angles are the same being inclined descending towards the front. This also enables easy operation of the authentication device 17 (easier to operate compared to the case where the device is arranged at a side portion because the device is closer to the user standing position). With an authentication device having a card reading surface exposed, a prepaid (subtractive) card that needs to be placed while in use slips off when the card reading surface is inclined descending towards the front. However, in the present embodiment, while the image display surface 9 is inclined descending towards the front, making it easier for users to see and press for the operation, the authentication device 17 is placed horizontally and thus prevents the card from slipping off even with the card that needs to be placed on it to be authenticated, thereby improving ease of use of the both.

When the image display surface 9 is inclined descending towards the front, the reflection of lights on the ceiling and the like is lessened and a display device such as an LCD is positioned adequately with respect to its view angle, making the display easier to see. Furthermore, if the image display surface 9 has a touch panel, the angle of screen keys becomes adequate, making the screen keys easier to press. Additionally, in the present embodiment, the numeric keypad 10 and the authentication key (log-in key) 11 are provided between the image display surface 9 and the authentication device mounting unit 8, making the authentication device 17 more recognizable than the authentication key (log-in key) 11. This makes users aware that the sequence of personal authentication is performed with a card or a fingerprint first. If the authentication device 17 is positioned to the left of the operating section 6, the operability of the authentication key (log-in key) and the keyboard appearing on the image display surface or the numeric keypad is not satisfactory when, for example, the device 17 is used on an information processing unit, such as an IC card access control system, and a user does not bring his/her employee ID card and enters with a temporary card. In terms of this, the operability is improved. More specifically, in the present embodiment, even in such a situation, the eyes of the user move in order from right to left (authentication device→authentication key→numeric keypad→screen keys), making it easier to recognize the order of operation to be performed. Accordingly, the flow of the operation not going from side to side makes it easier to operate the operating section 6.

In the present embodiment depicted in the figures, while two kinds of the grains (more specifically, grain patterns) are formed on the bottom surface of the concave portion 14, in place of the grain, forming irregularity shape, printing, decal, or the like can be employed, and more than two kinds of grains (marking for mounting) can be provided. Grain patterns are most preferably used in terms of low cost and not ruining the appearance.

Figure 16B:
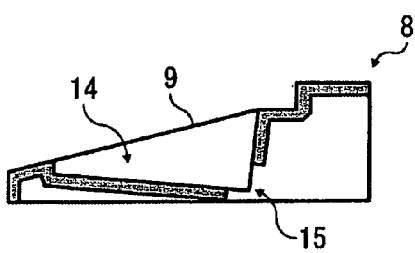
Figure 16C:
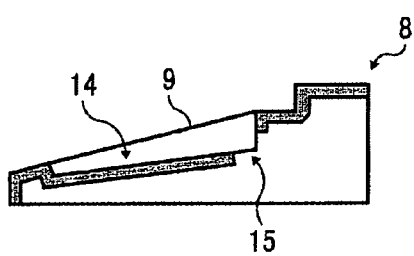
Figure 16D:
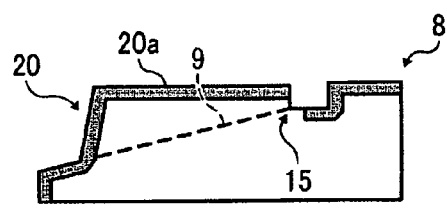

As depicted in FIGS. 16B and 16C, the bottom surface of the concave portion 14 may be angled to have an inclined surface. In the situation depicted in FIG. 16B, the bottom surface is inclined descending towards the back, and in the situation depicted in FIG. 16C, the bottom surface is inclined descending towards the front. In either situation, a wall surface on the front side of the concave portion 14 serves as a stopper for the movement of the authentication device 17, whereby the inclination of the authentication device 17 can be arbitrarily designed.

Although omitted to illustrate, one side of the authentication device 17 may be brought into contact at least one of the surfaces that are on the front, back, left, and right of the concave portion 14, which is orthogonal or nearly orthogonal (hereinafter, simply referred to as orthogonal or orthogonal surface) to the bottom surface that is the placement surface for the authentication device 17.

Second Embodiment

Figure 8A:
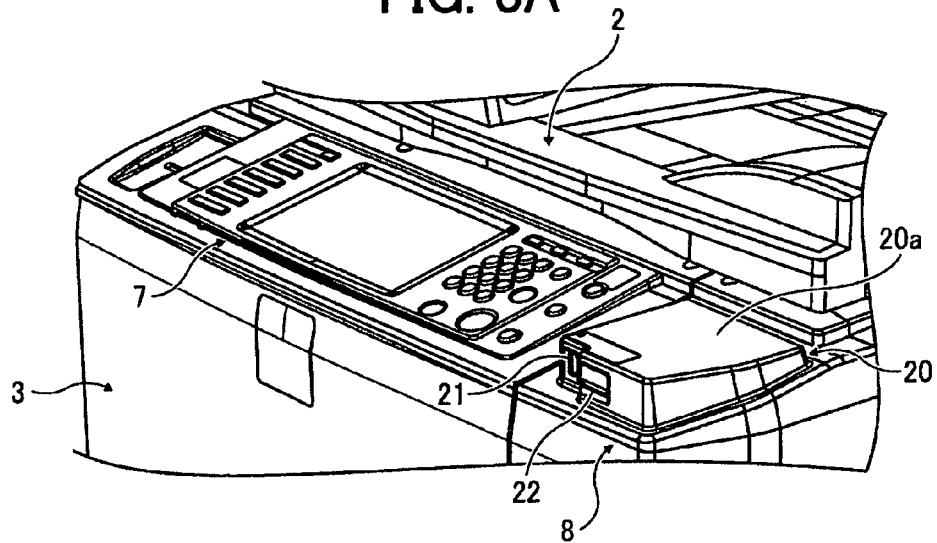
FIGS. 8A and 8B are perspective views of an image processing apparatus provided with an operating section according to a second embodiment of the invention viewed from the right front side, FIG. 8A with no authentication device being mounted on an authentication device mounting portion and FIG. 8B with the authentication device being mounted.
Figure 8B:
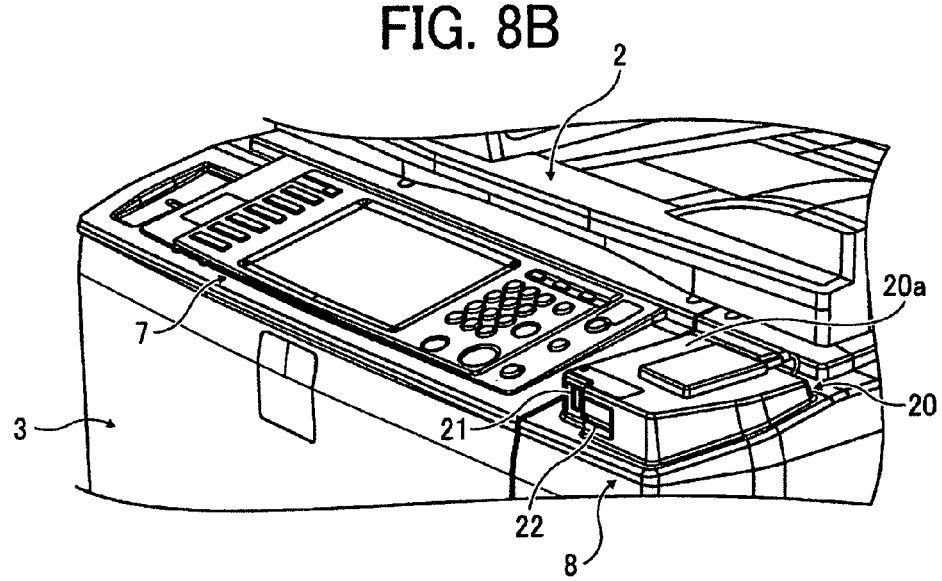
Figure 8C:
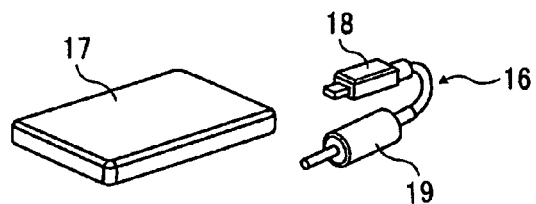
FIG. 8C is a perspective view illustrating an exemplary wiring layout of the authentication device according to the second embodiment.
Figure 9A:
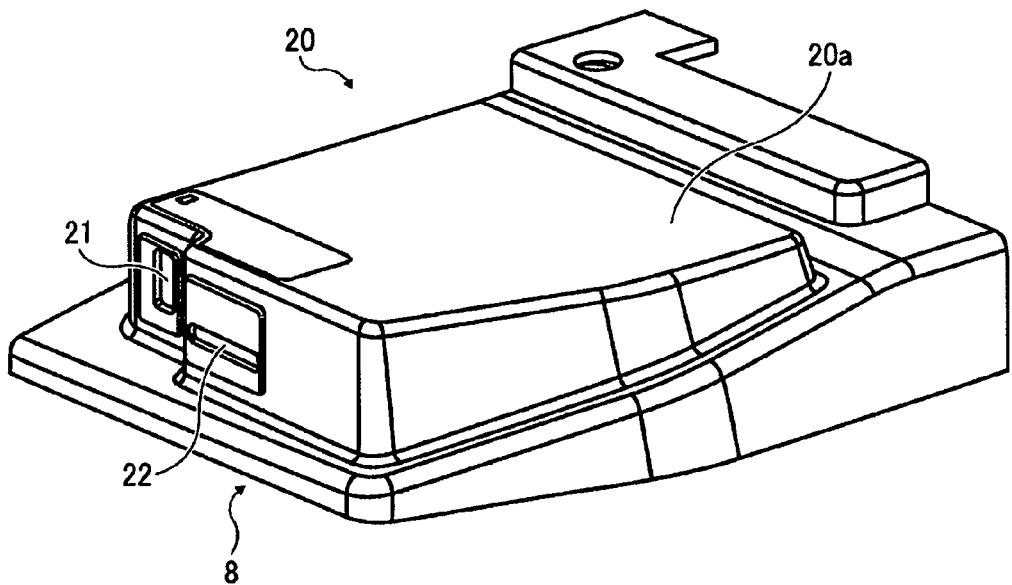
FIGS. 9A and 9B are enlarged perspective views of the authentication device mounting portion depicted in FIGS. 8A and 8B, respectively.
Figure 9B:
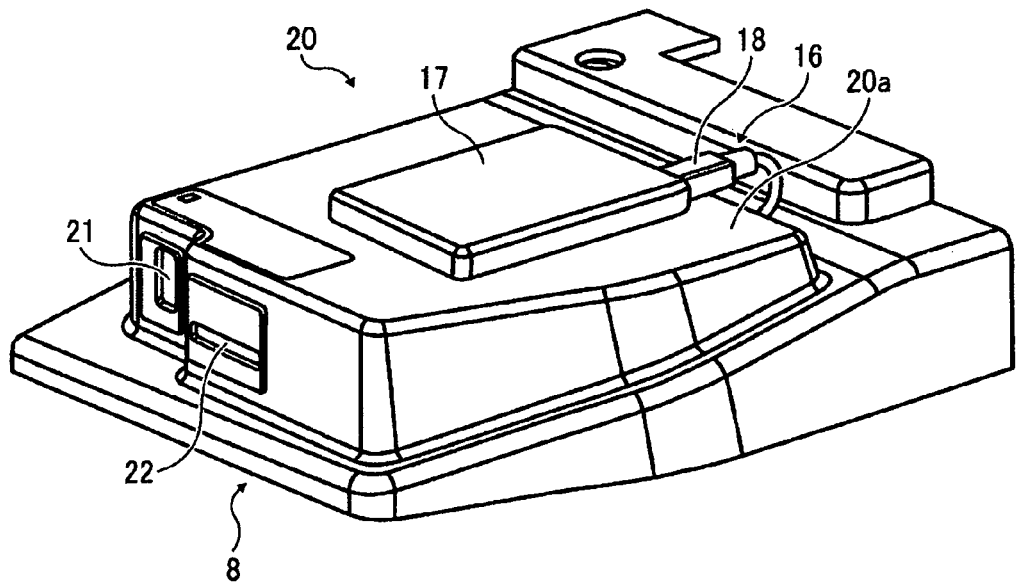
Figure 10A:
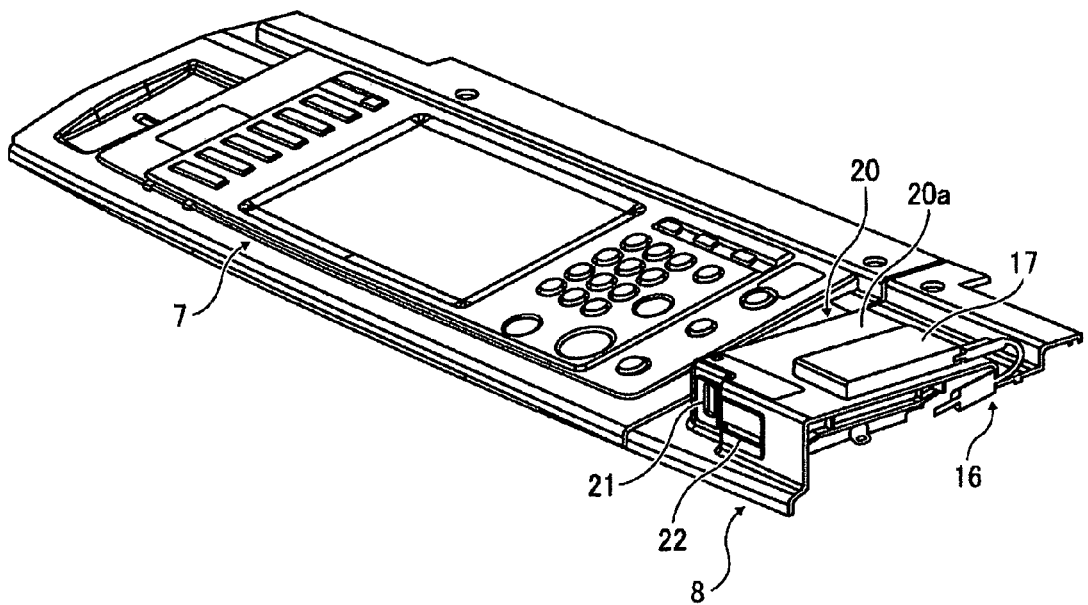
FIGS. 10A and 10B are perspective views of the authentication device mounting portion that is cut out of the apparatus depicted in FIGS. 8A and 8B.
Figure 10B:
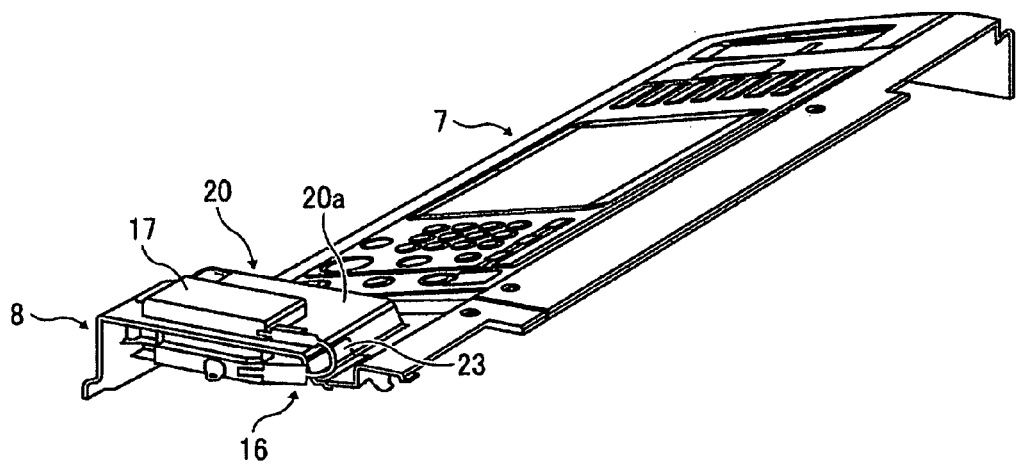

FIGS. 8A to 8C are perspective views of an image processing apparatus provided with an operating section according to a second embodiment of the invention viewed from the right front side, FIG. 8A with no authentication device 17 being mounted on the authentication device mounting portion and FIG. 8B with the authentication device 17 being mounted thereon. FIG. 8C is a perspective view illustrating an exemplary wiring layout of the USB cable 16 of the authentication device 17 according to the second embodiment. FIGS. 9A and 9B are enlarged perspective views of the authentication device mounting portion depicted in FIGS. 8A and 8B, respectively. The second embodiment is intended, by positioning the authentication device to be more prominent with the mounting position of the authentication device arranged above the operational panel as described later, to make the user aware that the sequence of personal authentication is performed with a card or a fingerprint first.

In the second embodiment, the authentication device mounting unit 8 includes a placement unit 20 of a pedestal shape so as to make the authentication device mounting unit 8 above the image display surface 9. More specifically, a planar surface 20a at the top of the placement unit 20 is the placement surface for the authentication device 17, and as depicted in 16D, the planar surface 20a is positioned above the image display surface 9. The placement unit 20 is provided with a surface orthogonal to the planar surface 20a that is the placement surface for the authentication device 17 on at least one side of the front, back, right, and left of the placement unit 20. In the example depicted in FIGS. 9A and 9B, the front surface facing towards the front of the apparatus 1 is the orthogonal surface, and a USB connector 21 and a slot 22 into which a card memory is inserted are provided thereon. While the USB connector 21, the slot 22 into which a card memory is inserted, and the like may certainly be provided on a surface not orthogonal to the planar surface 20a, providing them on the orthogonal surface rather than a twisted surface has advantages of not ruining the appearance, making it easier to recognize their locations, and the like.

Figures 11A, 11B:
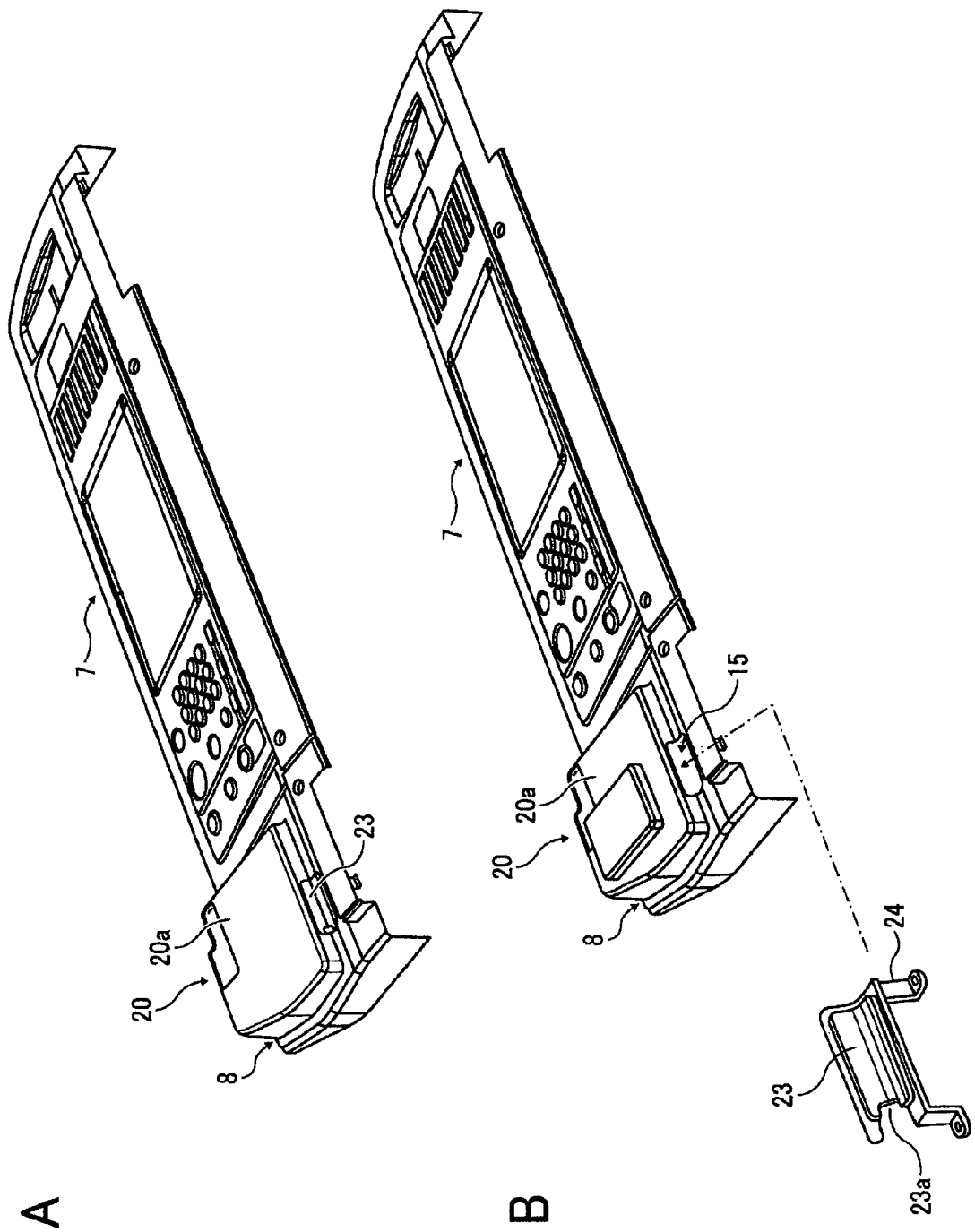
FIGS. 11A to 11D are perspective views illustrating the procedure of mounting the authentication device to the authentication device mounting portion according to the second embodiment viewed from the back of the apparatus depicted in FIG. 1.
Figure 11C:
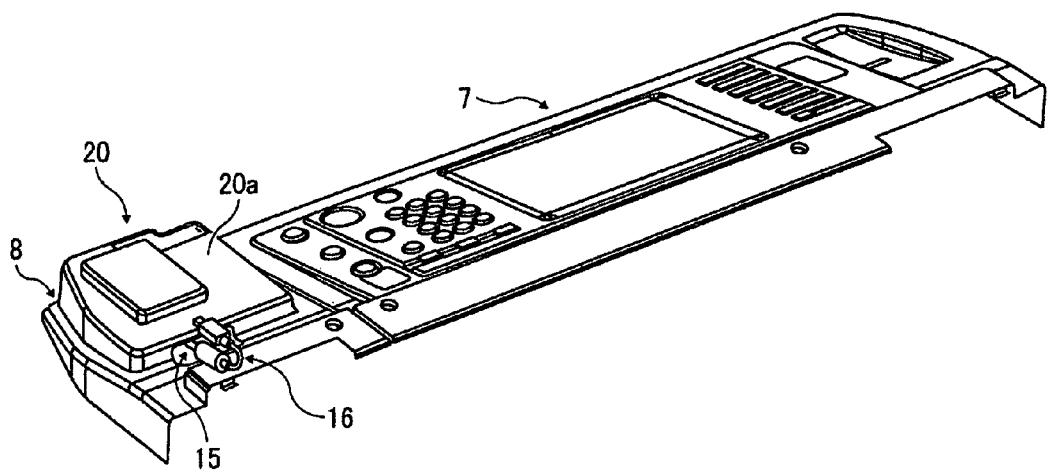
Figure 11D:
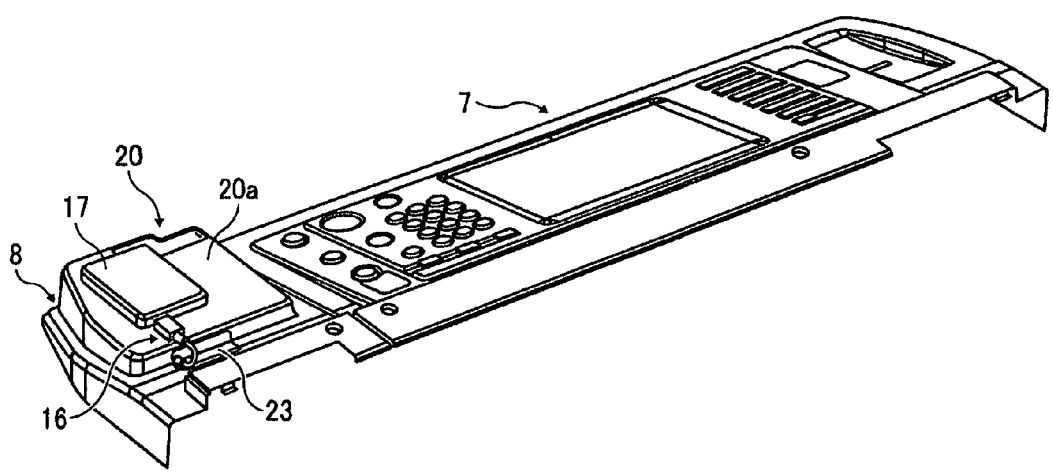

The back side of the placement unit 20, as depicted in FIGS. 10A and 10B and FIGS. 11A to 11D, is also a surface orthogonal to the planar surface 20a at the top of the placement unit 20, and the opening 15 for inserting the USB cable 16 is provided thereon. Because of the opening 15 for inserting the USB cable 16 wired from the authentication device 17 being relatively large when international specifications are considered (see FIG. 11B), it includes a detachable cover 23 provided with a cutout for inserting the USB cable 16 and a mounting bracket 24. Providing the detachable cover 23 offers an advantage of not ruining the appearance because the placement surface for the authentication device 17 and a surface having the opening can be hidden when the authentication device 17 is not mounted as an option. The cover 23 has an opening for inserting the USB cable 16. The cover 23 is preferably used because it can close up the space other than for the cable while hiding the ferrite core of the cable inside the operating section, and preventing a foreign object such as a clip from falling inside as well as not ruining the appearance. As for the shape of the opening of the cover 23, while a cutout 23a is provided at one end as in the example depicted in FIG. 11B, it can be a hole. However, the shape indicated as the example depicted in FIG. 11B is easier to form and thus is preferably used.

When there is an orthogonal surface available as in the second embodiment, an authentication device of a wireless or wired type being mounted externally can be aligned with that surface, thereby reducing the variation of mounting positions and not ruining the appearance when the authentication device is mounted as an option.

Figure 16E:
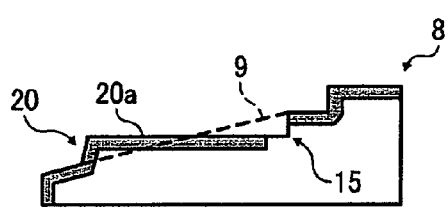
Figure 16F:
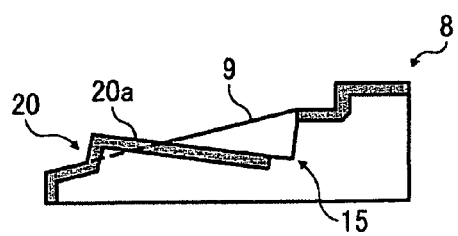
Figure 16G:
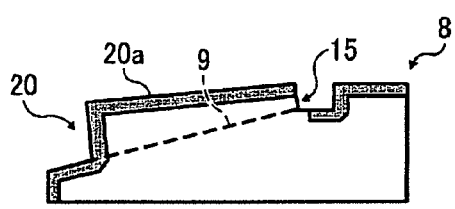

Other structures and effects are the same as those of the first embodiment and thus their explanations are omitted. In the second embodiment, if the USB connector 21, which is provided to be vertically long, is arranged to be horizontally long as needed, the placement unit 20 can be made low-profile (see FIG. 16E). With such a structure, the planar surface 20a that is the placement surface for the authentication device 17 can be arranged at the height crossing with the image display surface 9 of the operational panel 7 arranged to be inclined, more specifically, at the position where the inclined line drawn along the inclined surface of the image display surface 9 crosses the horizontal line drawn along the planar surface 20a at the top of the placement unit 20 when viewed from the side of the apparatus 1. If the planar surface 20a at the top of the placement unit 20 is inclined, it is preferably inclined descending towards the back as depicted in FIG. 16F. The reason is that, when the planar surface 20a is inclined as depicted in FIG. 16G, there is a possibility of the authentication device 17 being sheared down. However, if a preventive measure for shearing down or slipping off can be taken (for example, the planar surface 20a being adhesive or the like), it may be inclined as depicted in FIG. 16G.

Because the placement surface for the authentication device 17 is positioned below the image display surface 9 in the first embodiment, the portion of the authentication device 17 protruding above is reduced. Therefore, if the image processing apparatus is of a type scanning documents through a contact glass, the placement surface thus positioned is preferably used in terms of being not likely to impair the operability of opening/closing the ADF 2. When the placement surface for the authentication device 17 is arranged at the crossing height as described above, the same advantage can be attained.

In the second embodiment, because the readers of a recording medium such as an SD card and a USB memory are arranged below the placement surface for the authentication device 17, a personal authentication device (the authentication device 17 in the embodiment) and the plural readers can be arranged in a concentrated and recognizable manner and space saving can be achieved. In addition, a dividing portion is provided between the authentication device mounting unit 8 and the readers, the readers can be easily attached in a sort time in the situation where the readers for the recording medium including the SD card and the USB memory are optional.

Although omitted to illustrate, in the second embodiment, by either adhering or printing of two kinds of grain patterns, irregularity shapes, or decals, the placement position for the authentication device 17 can be formed to be easily recognized.

Third Embodiment

Figure 12A:
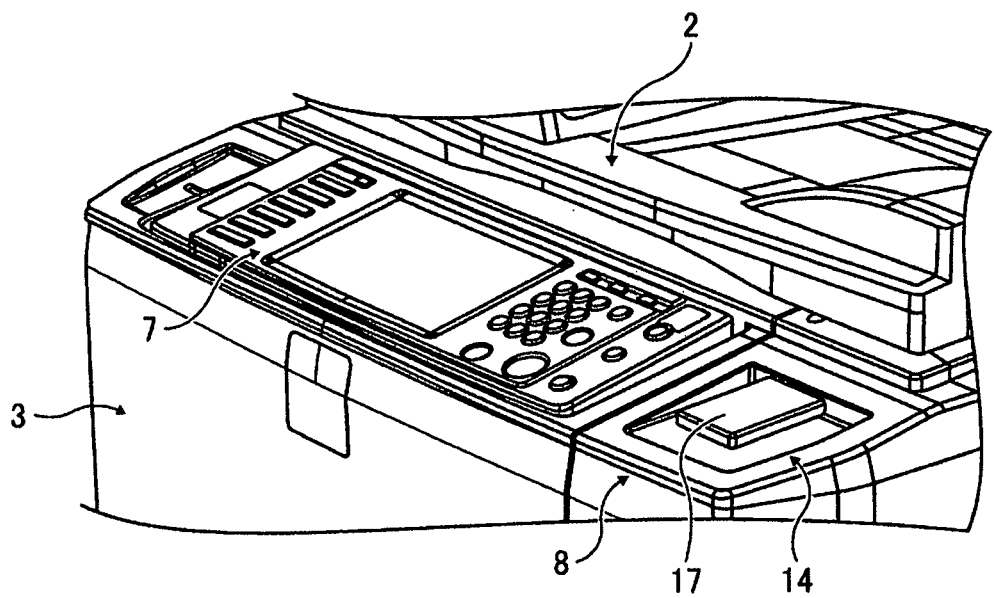
FIGS. 12A and 12B are perspective views of an image processing apparatus provided with an operating section according to a third embodiment of the invention viewed from the right front side.
Figure 12B:
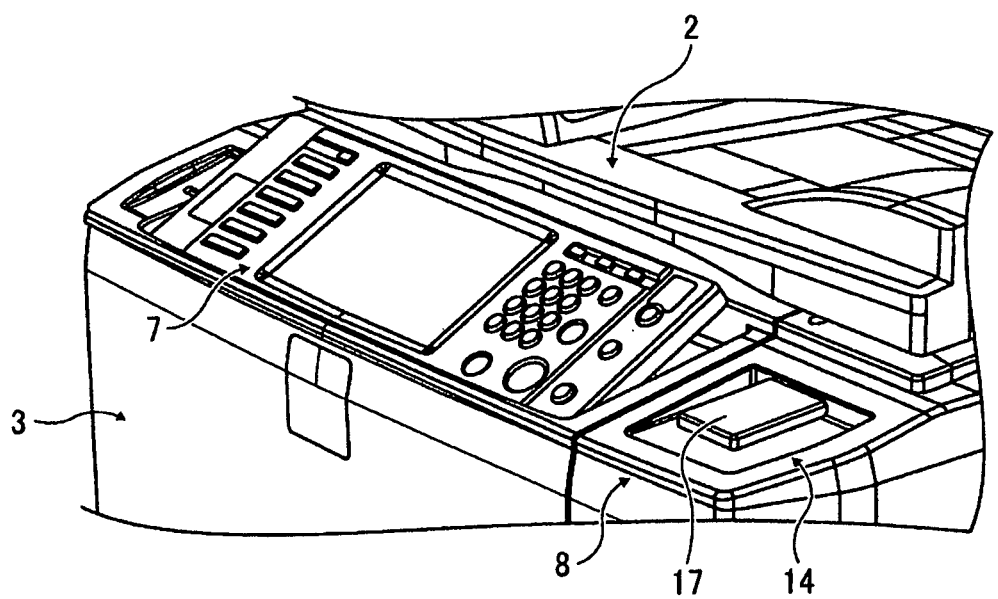
Figure 13:
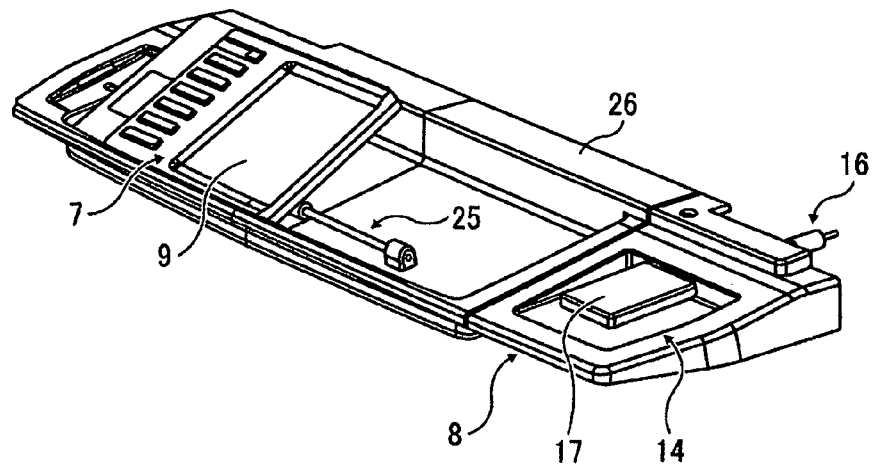
FIG. 13 is a perspective view illustrating an operational panel having a variable angle tilting mechanism that is cut out of the apparatus according to the third embodiment depicted in FIGS. 12A and 12B.
Figure 14:
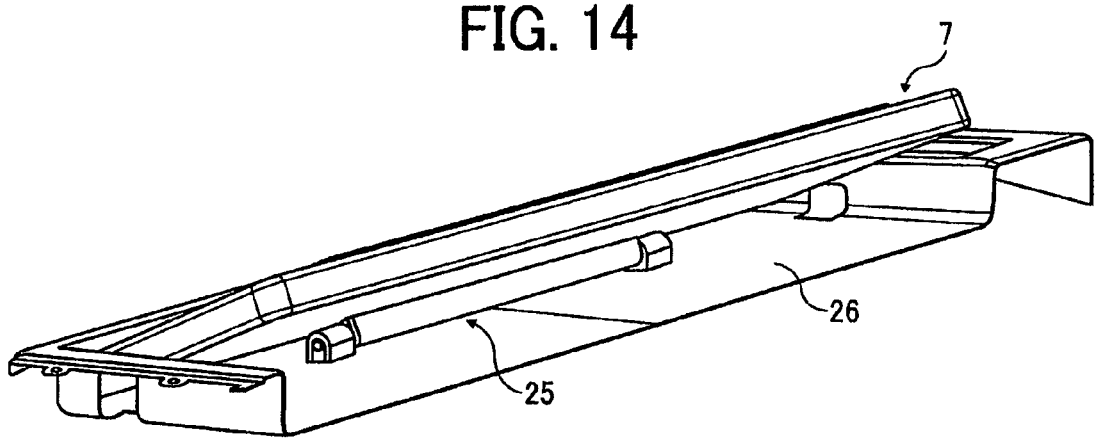
FIG. 14 is a perspective view of a rear portion of a lower cover of the operational panel that is cut out to illustrate a hinge for the operational panel having the variable angle tilting mechanism viewed from the back of the apparatus depicted in FIG. 1.
Figure 15:
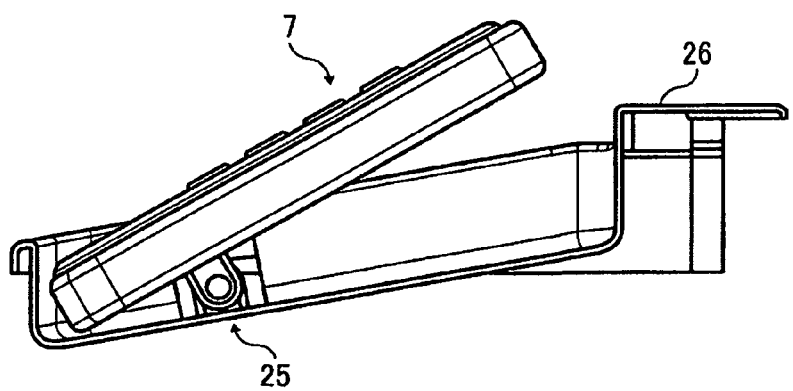
FIG. 15 is a side view of the operational panel that is cut out to illustrate the hinge for the operational panel.

FIGS. 12A and 12B are perspective views of an image processing apparatus provided with an operating section according to a third embodiment of the invention viewed from the right front side. FIG. 13 is a perspective view illustrating an operational panel having a variable angle tilting mechanism that is cut out of the apparatus according to the third embodiment depicted in FIGS. 12A and 12B. FIG. 14 is a perspective view illustrating a rear portion of a lower cover of the operational panel that is cut out to illustrate a hinge for the operational panel having the variable angle tilting mechanism viewed from the back of the apparatus. FIG. 15 is a side view of the operational panel 7 that is cut out to illustrate the hinge mechanism for the operational panel. In the third embodiment, a tilting mechanism 25 is provided on the upper surface of the concave portion of the operating section where the operational panel 7 is provided, and is employed as the hinge mechanism that supports the front portion of the operational panel 7 such that the operational panel 7 is vertically rotatable. The reference numeral 26 represents the lower cover of the operational panel.

The operational panel 7 with such a variable angle (tilting) mechanism is beneficial for users in any height. More specifically, by varying its angle, the angle can be adjusted for the height of the user, thereby not impairing the ease of view. When the angle of the image display surface 9 is varied with the variable angle (tilting) mechanism, however, it is preferable to maintain the placement surface for the authentication device 17 at a specific angle without being varied in terms of consistency in reading operation of the card and the like.

According to the invention, the authentication device is arranged forward of the document scanning unit and is positioned closer to the user standing position, thereby facilitating the manual authentication operation of a card or a fingerprint.

In the invention, suitable angles for respective operations are selected by setting different angles for the image display surface and for the authentication device placement surface, so that the image display surface and the placement surface for the authentication device can be set to their optimum angles for the user, making it easier for the user to use them.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An operating section structure positioned forward of a document scanning unit, the operating section structure comprising:
    an image display surface; and
    an authentication device placement surface for mounting a detachable authentication device at an angle different from the image display surface,
    wherein the authentication device is on the authentication device placement surface such that a bottom surface of the authentication device is in contact with the authentication device placement surface,
    when the authentication device is in use, the authentication device is exposed so that an user operates the authentication device,
    wherein an upper surface of the authentication device provides a contact surface in which an IC card is brought into contact thereof, and
    wherein at least a front portion of the contact surface of the authentication device protrudes upward from a level of the image display surface when viewed from a side.

2. The operating section structure according to claim 1, wherein the image display surface is inclined, descending towards front.

3. The operating section structure according to claim 1, wherein the authentication device placement surface is provided horizontally or nearly horizontally.

4. The operating section structure according to claim 1, wherein a key for authentication is arranged between the image display surface and the authentication device placement surface.

5. The operating section structure according to claim 1, wherein the authentication device placement surface is arranged on a right-hand side of the image display surface.

6. The operating section structure according to claim 1, wherein the authentication device placement surface is a bottom surface of a concave portion.

7. The operating section structure according to claim 6, wherein the authentication device placement surface, which is the bottom surface of the concave portion, is positioned below the image display surface.

8. The operating section structure according to claim 6, wherein the authentication device is mounted such that one of side surfaces of the authentication device is in contact with at least one of surfaces on front, back, right, and left of the concave portion, which is orthogonal or nearly orthogonal to the authentication device placement surface.

9. The operating section structure according to claim 8, wherein the surface orthogonal or nearly orthogonal to the authentication device placement surface is a surface on a back side of the authentication device placement surface and an opening for inserting a flexible cable for connecting to the authentication device is provided on the surface on the back side.

10. The operating section structure according to claim 6, further comprising a detachable cover that covers the concave portion and forms a nearly coplanar surface with the image display surface.

11. The operating section structure according to claim 1, wherein the authentication device placement surface is a top surface of a pedestal shaped portion,
wherein the pedestal shaped portion is a supporter on which the authentication device is mounted thereon.

12. The operating section structure according to claim 11, wherein the authentication device placement surface, which is the top surface of the pedestal shaped portion, is positioned above the image display surface.

13. The operating section structure according to claim 11, wherein the authentication device placement surface, which is the top surface of the pedestal shaped portion, is positioned below the image display surface.

14. The operating section structure according to claim 11, wherein at least one of side surfaces of the pedestal shaped portion is a surface orthogonal to the authentication device placement surface, which is the top surface of the pedestal shaped portion.

15. The operating section structure according to claim 14, wherein a recording medium reader is provided on the surface orthogonal to the authentication device placement surface.

16. The operating section structure according to claim 13, wherein the authentication device placement surface, which is the top surface of the pedestal shaped portion, is an inclined surface descending towards back.

17. The operating section structure according to claim 13, wherein the authentication device placement surface, which is the top surface of the pedestal shaped portion, is an inclined surface descending towards front.

18. The operating section structure according to claim 13, wherein the top surface of the pedestal shaped portion is positioned at a height crossing the image display surface.

19. An image processing apparatus comprising an operating section structure positioned forward of a document scanning unit, wherein
the operating section structure includes:
an image display surface; and
an authentication device placement surface for mounting a detachable authentication device at an angle different from the image display surface,
wherein the authentication device is on the authentication device placement surface such that a bottom surface of the authentication device is in contact with the authentication device placement surface,
when the authentication device is in use, the authentication device is exposed so that an user operates the authentication device,
wherein an upper surface of the authentication device provides a contact surface in which an IC card is brought into contact thereof, and
wherein at least a front portion of the contact surface of the authentication device protrudes upward from a level of the image display surface when viewed from a side.

20. An information processing apparatus comprising an operating section structure positioned forward of a document scanning unit, wherein
the operating section structure includes:
an image display surface; and
an authentication device placement surface for mounting a detachable authentication device at an angle different from the image display surface,
wherein the authentication device is on the authentication device placement surface such that a bottom surface of the authentication device is in contact with the authentication device placement surface,
when the authentication device is in use, the authentication device is exposed so that an user operates the authentication device,
wherein an upper surface of the authentication device provides a contact surface in which an IC card is brought into contact thereof, and
wherein at least a front portion of the contact surface of the authentication device protrudes upward from a level of the image display surface when viewed from a side.

21. The operating section structure according to claim 6, wherein a standing wall portion, which forms the concave portion, is arranged near a lateral side of the authentication device.

22. The operating section structure according to claim 11, wherein the pedestal shaped portion protrudes upward with respect to the image display surface.

23. The operating section structure according to claim 1, wherein the authentication device placement surface inclines downwardly from a rear side portion to a front side portion of an image processing apparatus.

24. An operating section structure positioned forward of a document scanning unit, the operating section structure comprising:
an image display surface; and
an authentication device placement surface for mounting a detachable authentication device at an angle different from the image display surface,
wherein the authentication device is on the authentication device placement surface such that a bottom surface of the authentication device is in contact with the authentication device placement surface,
when the authentication device is in use, the authentication device is exposed so that an user operates the authentication device, and
wherein at an exposed upper surface of the authentication device, at least a front-side portion of the upper surface of the authentication device protrudes upward from a level of the image display surface when viewed from a side.

* * * * *